(12) United States Patent
Seki et al.

(10) Patent No.: US 10,988,649 B2
(45) Date of Patent: Apr. 27, 2021

(54) METHOD FOR IMPARTING WATER REPELLENCY TO SUBSTRATE, SURFACE TREATMENT AGENT, AND METHOD FOR SUPPRESSING COLLAPSE OF ORGANIC PATTERN OR INORGANIC PATTERN IN CLEANING SUBSTRATE SURFACE WITH CLEANING LIQUID

(71) Applicant: TOKYO OHKA KOGYO CO., LTD., Kawasaki (JP)

(72) Inventors: Kenji Seki, Kawasaki (JP); Takumi Namiki, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 123 days.

(21) Appl. No.: 16/229,883

(22) Filed: Dec. 21, 2018

(65) Prior Publication Data

US 2019/0203090 A1 Jul. 4, 2019

(30) Foreign Application Priority Data

Dec. 28, 2017 (JP) .............................. JP2017-254853

(51) Int. Cl.
*C09K 3/18* (2006.01)
*G03F 7/075* (2006.01)
(Continued)

(52) U.S. Cl.
CPC .................. *C09K 3/18* (2013.01); *C09D 5/00* (2013.01); *C09D 7/63* (2018.01); *G03F 7/075* (2013.01);
(Continued)

(58) Field of Classification Search
None
See application file for complete search history.

(56) References Cited

U.S. PATENT DOCUMENTS 3,933,531 A 1/1976 Sawa et al.
4,572,853 A 2/1986 Ikeya et al.
(Continued)

FOREIGN PATENT DOCUMENTS

| JP | H07-142349 | 6/1995 |
| JP | H11-511900 | 10/1999 |
| JP | 2010-129932 A | 6/2010 |

OTHER PUBLICATIONS

Office Action issued in the U.S. Appl. No. 16/216,261, dated Oct. 16, 2020.

*Primary Examiner* — Joseph D Anthony
(74) *Attorney, Agent, or Firm* — Knobbe Martens Olson & Bear LLP

(57) ABSTRACT

A method for imparting water repellency to a substrate; a surface treatment agent used in the method; and a method for suppressing collapse of an organic or inorganic pattern in cleaning the substrate surface with a cleaning liquid. The method includes exposing a surface of a substrate to a surface treatment agent, the surface treatment agent including a water-repelling agent and a nitrogen-containing heterocyclic compound, the water-repelling agent including an alkoxymonosilane compound having a hydrophobic group bonded to a silicon atom. A surface treatment agent including a water-repelling agent and a nitrogen-containing heterocyclic compound, the water-repelling agent (A) including an alkoxymonosilane compound having a hydrophobic group bonded to a silicon atom.

10 Claims, 1 Drawing Sheet

(51) Int. Cl.
*H01L 21/02* (2006.01)
*G03F 7/20* (2006.01)
*C09D 7/63* (2018.01)
*G03F 7/40* (2006.01)
*G03F 7/16* (2006.01)
*C09D 5/00* (2006.01)
*C08K 5/3472* (2006.01)
*C08K 5/3445* (2006.01)
*C08K 5/5419* (2006.01)

(52) U.S. Cl.
CPC ............ *G03F 7/165* (2013.01); *G03F 7/2041* (2013.01); *G03F 7/40* (2013.01); *H01L 21/02057* (2013.01); *C08K 5/3445* (2013.01); *C08K 5/3472* (2013.01); *C08K 5/5419* (2013.01)

(56) References Cited

U.S. PATENT DOCUMENTS

| | | | |
|---|---|---|---|
| 4,704,234 A | 11/1987 | Petersen et al. | |
| 5,348,590 A | 9/1994 | Shigemura et al. | |
| 5,661,196 A * | 8/1997 | Mayer | B05D 7/06 523/122 |
| 5,695,551 A * | 12/1997 | Buckingham | C04B 41/009 106/2 |
| 5,702,767 A | 12/1997 | Peterson et al. | |
| 5,872,062 A | 2/1999 | Hsu | |
| 5,960,251 A | 9/1999 | Brusic et al. | |
| 5,982,035 A | 11/1999 | Tran et al. | |
| 6,403,163 B1 * | 6/2002 | Fisher | C04B 40/0039 427/387 |
| 2006/0019034 A1 * | 1/2006 | Toyoda | H05K 3/1208 427/322 |
| 2006/0127563 A1 * | 6/2006 | Toyoda | H01L 51/56 427/58 |
| 2007/0246134 A1 | 10/2007 | Hirao et al. | |
| 2008/0241489 A1 * | 10/2008 | Ishibashi | G03F 7/11 428/199 |
| 2008/0318070 A1 | 12/2008 | Hirao et al. | |
| 2011/0195190 A1 | 8/2011 | Koshiyama et al. | |
| 2012/0199385 A1 | 8/2012 | Hirao et al. | |
| 2013/0052824 A1 * | 2/2013 | Hagiwara | G03F 7/0046 438/689 |
| 2014/0131080 A1 | 5/2014 | Hirao et al. | |
| 2015/0258707 A1 * | 9/2015 | Hirata | B28B 7/465 428/413 |
| 2019/0203090 A1 | 7/2019 | Seki et al. | |

* cited by examiner

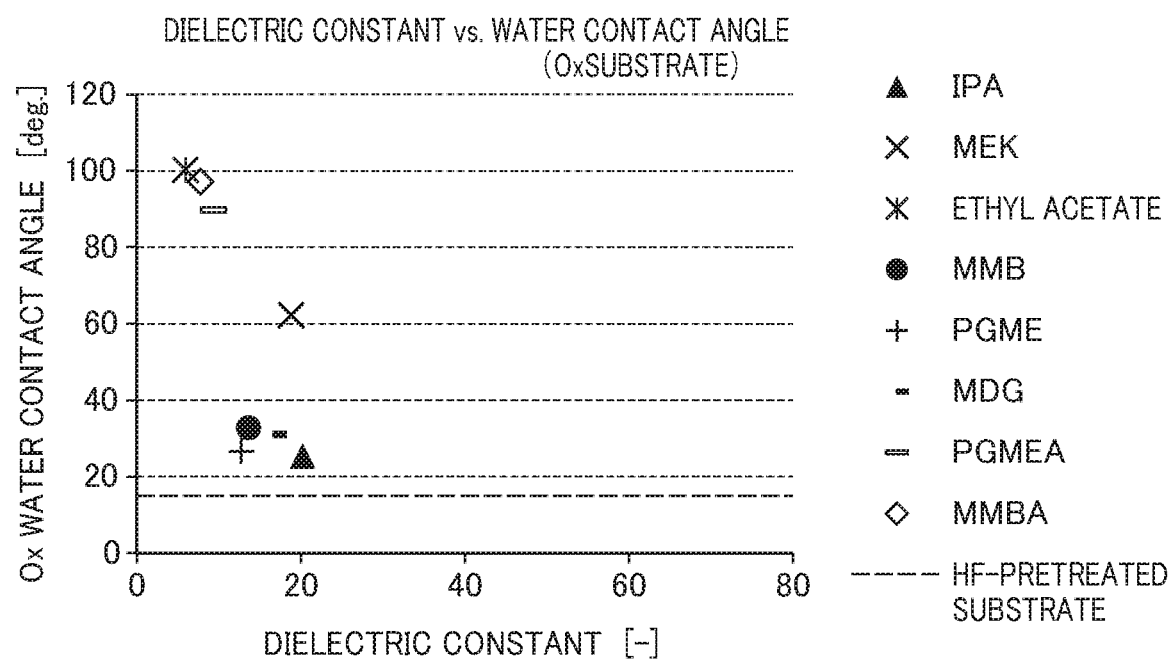

US 10,988,649 B2

METHOD FOR IMPARTING WATER REPELLENCY TO SUBSTRATE, SURFACE TREATMENT AGENT, AND METHOD FOR SUPPRESSING COLLAPSE OF ORGANIC PATTERN OR INORGANIC PATTERN IN CLEANING SUBSTRATE SURFACE WITH CLEANING LIQUID

This application claims priority to Japanese Patent Application No. 2017-254853, filed Dec. 28, 2017, the entire content of which is incorporated herein by reference.

BACKGROUND OF THE INVENTION

Field of the Invention

The present invention relates to a method for imparting water repellency to a substrate, a surface treatment agent used for the method, and a method for suppressing collapse of an organic pattern or an inorganic pattern in cleaning a substrate surface with a cleaning liquid, and particularly relates to a method for imparting water repellency to a substrate used in manufacturing a semiconductor integrated circuit, a surface treatment agent used for the method, and a method for suppressing collapse of an organic pattern or an inorganic pattern in cleaning a substrate surface with a cleaning liquid.

Related Art

In the manufacture of semiconductor devices and the like, lithography technology is applied prior to conducting processing such as etching on a substrate. With this lithography technology, a photosensitive resin composition is used to provide a photosensitive resin layer on the substrate, then this is selectively irradiated with and exposed to actinic radiation, and a developing process is performed, thereafter, the photosensitive resin layer is selectively dissolved and removed to form an organic pattern on the substrate. Then, an inorganic pattern is formed on the substrate by performing an etching process using the organic pattern as a mask.

Incidentally, in recent years, trends toward higher integration and miniaturization of semiconductor devices have grown, and thus progress toward refinement or higher aspect ratios of an organic pattern as a mask and an inorganic pattern produced by etching processes have advanced. In the meantime, however, a problem of so-called pattern collapse has arisen. This pattern collapse is a phenomenon in which when several organic patterns and inorganic patterns are formed on a substrate in parallel, adjacent patterns close in so as to lean on one another, and the patterns are damaged and peeled off from the base depending on the situation. If such pattern collapse occurs, the desired product will not be obtained, thereby causing a decline in the yield and reliability of the product.

This pattern collapse is known to occur when drying a cleaning liquid in a cleaning process after pattern formation, due to the surface tension of this cleaning liquid. In other words, when the cleaning liquid is removed in a drying step, stress based on the surface tension of the cleaning liquid has an effect between patterns, whereby pattern collapse occurs.

Consequently, numerous experiments have been carried out so far to prevent pattern collapse by adding a substance, which causes the surface tension to decrease, to the cleaning liquid. For example, a cleaning liquid to which isopropyl alcohol is added, a cleaning liquid to which a fluorine-based surfactant is added, and the like, have been proposed (refer to, for example, Patent Document 1). However, with the cleaning liquid scheme described in Patent Document 1, there has been a problem in that prevention of pattern collapse is insufficient.

In addition, although not the same as pattern collapse, in order to improve adhesion between the resin pattern as the mask and the surface of the substrate to prevent a partial loss of the resin pattern by a chemical developing solution, hydrophobization treatment (silylation treatment) using hexamethyl disilazane (HMDS) has been being performed on the surface of the substrate before providing the substrate with a photosensitive resin layer (refer to, for example, "Background Art" of Patent Document 2). However, with the method described in Patent Document 2, the desired effects may not be obtained because the silylation treatment of the surface of the treatment target is not sufficient.

Patent Document 1: Japanese Unexamined Patent Application, Publication No. H07-142349
Patent Document 2: Japanese Unexamined Patent Application, Publication No. H11-511900

SUMMARY OF THE INVENTION

Furthermore, imparting water repellency to the substrate surface using a conventional silylation agent such as HMDS has reached its limit. Even if the conditions for imparting water repellency are changed, it has been difficult to achieve a high degree of water repellency in which a contact angle of water is 100° or more, and there is room for improvement in the effect of preventing pattern collapse using the silylation agent.

The present invention has been made considering the above situation, and has an object to provide a method for imparting water repellency to a substrate, which can provide a substrate that is in excellent in water repellency; a surface treatment agent to be used for the method; and a method for suppressing collapse of an organic pattern or an inorganic pattern in cleaning the substrate surface with a cleaning liquid, which can suppress pattern collapse.

The present inventors have found that a high degree of water repellency (for example, water repellency in which a contact angle of water is 100° or more) can be achieved by treating a substrate surface with a silane compound having a specific structure and a nitrogen-containing heterocyclic compound having a specific structure, thereby arriving at completion of the present invention. Specifically, the present invention provides the following.

A first aspect of the present invention is a method for imparting water repellency to a substrate, the method including exposing a surface of a substrate to a surface treatment agent,
wherein the surface treatment agent includes a water-repelling agent (A) and a nitrogen-containing heterocyclic compound (B), and
the water-repelling agent (A) includes an alkoxymonosilane compound having a hydrophobic group bonded to a silicon atom.

A second aspect of the present invention is a surface treatment agent including a water-repelling agent (A) and a nitrogen-containing heterocyclic compound (B),
wherein the water-repelling agent (A) includes an alkoxymonosilane compound having a hydrophobic group bonded to a silicon atom.

A third aspect of the present invention is a method for suppressing collapse of an organic pattern or an inorganic pattern in cleaning the substrate surface with a cleaning liquid, the method including imparting water repellency to a substrate surface having an organic pattern or an inorganic pattern by the method according to the first aspect.

The method for imparting water repellency to a substrate according to the present invention can provide a substrate excellent in water repellency. The surface treatment agent according to the present invention can provide the method for imparting water repellency to the substrate. The method for suppressing collapse of an organic pattern or an inorganic pattern in cleaning the substrate surface with a cleaning liquid according to the present invention can suppress pattern collapse.

BRIEF DESCRIPTION OF THE DRAWINGS

FIG. 1 is a view showing a relationship between a water contact angle on an Ox substrate, and dielectric constants of various solvents.

DETAILED DESCRIPTION OF THE INVENTION

Hereinafter, an embodiment of the present invention will be described in detail, but the present invention is not limited to the following embodiment, and appropriate modification can be added within the scope of the object of the present invention.

<<Method for Imparting Water Repellency to Substrate>>

A method for imparting water repellency to a substrate according to the first aspect includes exposing a surface of the substrate to a surface treatment agent. The surface treatment agent includes a water-repelling agent (A) and a nitrogen-containing heterocyclic compound (B). The water-repelling agent (A) includes an alkoxymonosilane compound having a hydrophobic group bonded to a silicon atom.

As the "substrate" that is a subject to which water repellency is imparted, a substrate used for producing semiconductor devices is exemplified; the "surface of the substrate" is exemplified by the surface of the substrate itself, the surfaces of an organic pattern and an inorganic pattern provided on the substrate, as well as the surfaces of an inorganic layer and an organic layer that have not been patterned.

As mentioned below, from the viewpoint of suppressing collapse of an organic pattern or an inorganic pattern in cleaning a surface of the substrate with a cleaning liquid, it is preferable that the substrate has the organic pattern or the inorganic pattern on the surface exposed to the surface treatment agent. Examples of the organic pattern provided on the substrate include a resin pattern formed on a substrate by way of a photolithography method using photoresist and the like. Such an organic pattern can be formed, for example, by forming an organic layer, which is a film of photoresist, on the substrate, exposing this organic layer through a photomask, and developing. In addition to the surface of the substrate itself, the organic layer may be an organic layer that is provided on the surface or the like of a laminated film provided on the surface of the substrate. Although such an organic film or layer is not particularly limited, a film of organic matter provided in order to form an etching mask in manufacturing process of a semiconductor device is exemplified.

Examples of the inorganic pattern provided on the substrate include a pattern that has been formed by producing an etching mask on the surface of an inorganic layer present on the substrate by way of a photoresist method, and subsequently performing an etching process. Examples of the inorganic layer include, in addition to the substrate itself, an oxide film of an element constituting the substrate, and a film or layer, etc. of inorganic matter such as silicon nitride, titanium nitride, and tungsten, and the like, formed on the surface of the substrate. Although such a film or layer is not particularly limited, a film or layer of inorganic matter, etc. that is formed in the manufacturing process of the semiconductor device is exemplified.

Examples of the method of exposing the surface of the substrate to the surface treatment agent include a method of exposing a surface of a substrate to a surface treatment agent that may include a solvent by application (for example, coating) by means of coating methods such as a dip coating method, or a spin coating method, a roll coating method, and a doctor blading method, and the like. The exposure temperature is, for example, 10° C. or higher and 90° C. or lower, preferably 20° C. or higher and 80° C. or lower, more preferably 30° C. or higher and 70° C. or lower, and further preferably 40° C. or higher and 60° C. or lower. The exposure time is preferably one minute or more and 30 minutes or less, and more preferably 5 minutes or more and 10 minutes or less from the viewpoint of the water repellency (for example, a contact angle of water). After film formation, cleaning (for example, cleaning with water, activator rinse, and the like) and/or drying (cleaning by nitrogen blowing, and the like) may be carried out if necessary. Furthermore, to the treated substrate after drying, heat treatment at 100° C. or higher and 300° C. or lower may be additionally carried out if necessary.

The exposure causes binding of an alkoxymonosilane compound having a hydrophobic group bonded to the below-mentioned silicon atom to the surface of the substrate, and imparts water repellency to the surface of the substrate.

From the viewpoint of water repellency, the contact angle of water on the substrate after exposure to the surface treatment agent can be 50° or more, preferably 60° or more, more preferably 70° or more, further preferably 90° or more, particularly preferably 100° or more, and the most preferably 101° or more. The upper limit of the contact angle is not particularly limited, but is, for example, 140° or less, and typically 130° or less. Note here that when the contact angle is 100° or more, the effect of preventing the pattern collapse can be greatly improved.

<Surface Treatment Agent>

The present invention relates to a surface treatment agent. The surface treatment agent according to the second aspect includes a water-repelling agent (A) and a nitrogen-containing heterocyclic compound (B). The water-repelling agent (A) includes an alkoxymonosilane compound having a hydrophobic group bonded to a silicon atom. As described above, use of the surface treatment agent can cause an alkoxymonosilane compound having a hydrophobic group to be bonded to a surface of a substrate. When the alkoxymonosilane compound is bonded to the substrate, a monomolecular film derived from the alkoxymonosilane compound can be formed on the substrate surface. Such a monomolecular film is preferably a self-assembled monolayer (SAM) film in which a network of siloxane bonds is formed in the plane direction of the substrate. The monomolecular film and the self-assembled monolayer film will be described later in detail. Hereinafter, each component will be described.

[Water-Repelling Agent (A)]

The alkoxymonosilane compound having a hydrophobic group bonded to a silicon atom included in the water-repelling agent (A) is a compound including one silicon atom, at least one hydrophobic group bonded to the silicon atom, and at least one alkoxy group bonded to the silicon atom.

From the viewpoint of water repellency, the hydrophobic group of the alkoxymonosilane compound is preferably a chain aliphatic hydrocarbon group having 3 or more and 20 or less carbon atoms, more preferably a chain aliphatic hydrocarbon group having 6 or more and 18 or less carbon atoms, further preferably a chain aliphatic hydrocarbon group having 7 or more and 12 or less carbon atoms, particularly preferably a chain aliphatic hydrocarbon group having 8 or more and 11 or less carbon atoms, and the most preferably a chain aliphatic hydrocarbon group having 8 or more and 10 or less carbon atoms. In the chain aliphatic hydrocarbon group, a part or all of the hydrogen atoms may be substituted with a halogen atom(s) (a fluorine atom, etc.), and the chain aliphatic hydrocarbon group may be straight chain or branched chain, but it is preferably a straight-chain aliphatic hydrocarbon group in which a part or all of the hydrogen atoms may be substituted with a fluorine atom(s).

An alkoxy group of the alkoxymonosilane compound is represented by the general formula: RO— (R denotes an alkyl group), and the alkyl group represented by the R is preferably a straight-chain or branched chain alkyl group, and more preferably a straight-chain alkyl group. Furthermore, the number of carbon atoms of the alkyl group represented by the R is not particularly limited. However, from the viewpoint of control at the time of hydrolysis and condensation, the number is preferably 1 or more and 10 or less, more preferably 1 or more and 5 or less, and further preferably 1 or 2. Specific examples of the alkoxy group of the alkoxymonosilane compound include a methoxy group, an ethoxy group, a propoxy group, an isopropoxy group, a butoxy group, a sec-butoxy group, a t-butoxy group, and the like.

The alkoxymonosilane compound is preferably a compound represented by the following formula (1).

$$R^1_n SiX_{4-n} \quad (1)$$

(In the above general formula, $R^1$ each independently is a mono-valent organic group, at least one of $R^1$ is a chain aliphatic hydrocarbon group having 3 or more and 20 or less carbon atoms, in which a part or all of the hydrogen atoms may be substituted with a fluorine atom(s); X is an alkoxy group; and n is an integer of 1 or more and 3 or less.) The mono-valent organic group of $R^1$ includes an alkyl group, an aromatic hydrocarbon group, an amino group, a monoalkylamino group, a dialkylamino group, and the like. The alkyl group is preferably a straight-chain or branched chain alkyl group having 1 or more and 20 or less carbon atoms (preferably, 1 or more and 8 or less carbon atoms), and more preferably a methyl group, an ethyl group, an n-propyl group, and an isopropyl group. The aromatic hydrocarbon group is preferably a phenyl group, a naphthyl group, a biphenylyl group, an anthryl group, and a phenanthrenyl group, more preferably a phenyl group and a naphthyl group, and particularly preferably a phenyl group. The alkyl group included in the monoalkylamino group or the dialkylamino group may include a nitrogen atom, an oxygen atom, or a carbonyl group in the chain, and may be a straight-chain alkyl group or a branched chain alkyl group. The number of carbon atoms of the alkyl group included in the monoalkylamino group or the dialkylamino group is not particularly limited, and the number is preferably 1 or more and 20 or less, more preferably 1 or more and 10 or less, and particularly preferably 1 or more and 6 or less.

X is preferably an alkoxy group having 1 or more and 5 or less carbon atoms. Specific examples of X include alkoxy groups such as a methoxy group, an ethoxy group, an n-propoxy group, an isopropoxy group, an n-butoxy group, a sec-butoxy group, and a t-butoxy group. Among them, particularly, from the viewpoint of control at the time of hydrolysis or condensation, a methoxy group, an ethoxy group, an isopropoxy group or a butoxy group is preferable. Furthermore, the alkoxymonosilane compound is preferably a trialkoxymonosilane compound.

The alkoxymonosilane compounds exemplified above can be used alone or by mixing two or more thereof. Specific examples of such an alkoxymonosilane compound include propyltrimethoxysilane, 3,3,3-trifluoropropyltrimethoxysilane, n-hexyltrimethoxysilane, n-octyltrimethoxysilane, n-dodecyltrimethoxysilane, n-octadecyltrimethoxysilane, and the like, and preferably n-hexyltrimethoxysilane, n-octyltrimethoxysilane, n-dodecyltrimethoxysilane, or n-octadecyltrimethoxysilane, and more preferably n-octyltrimethoxysilane, n-dodecyltrimethoxysilane, or n-octadecyltrimethoxysilane.

Use of the above-described alkoxymonosilane compound as the water-repelling agent (A) enables formation of a monomolecular film on a substrate surface. When a monomolecular film derived from an alkoxymonosilane compound having a hydrophobic group is formed on the substrate surface, the substrate surface is made to have a high degree of water-repellency. Particularly, from the viewpoint of the high degree of water-repellency, it is preferable that in the monomolecular film, a network of siloxane bonds is formed in the plane direction of the substrate. Such a monomolecular film is a so-called self-assembled monolayer film. In the self-assembled monolayer film, since residues derived from the alkoxymonosilane compound are densely included and the residues are bonded to each other by a siloxane bond, the monomolecular film is firmly bonded to the substrate surface. As a result, a particularly high degree of an effect of the water repellency can be expressed. Such a self-assembled monolayer film can be formed by using a trialkoxymonosilane compound and/or a dialkoxymonosilane compound as the water-repelling agent (A) as described above. Formation of a monomolecular film can be confirmed based on, for example, a change in film thickness, a change in contact angle, and X-ray photoelectron spectroscopy (XPS). A film thickness of the monomolecular film having water repellency can be, for example, 20 nm or less, preferably 10 nm or less, more preferably 5 nm or less, further preferably 3 nm or less, particularly preferably 1 nm or less, and the most preferably 0.5 nm or less.

The content of the alkoxymonosilane compound as the water-repelling agent (A) in the surface treatment agent is not particularly limited as long as the effect of the present invention is not impaired, but the content with respect to the total amount of the surface treatment agent is preferably 0.001% by mass or more, more preferably 0.01% by mass or more, further preferably 0.1% by mass or more, particularly preferably 0.5% by mass or more, and the most preferably 1.0% by mass or more. The upper limit value of the content of the alkoxymonosilane compound as the water-repelling agent (A) in the surface treatment agent is not particularly limited as long as the effect of the present invention is not impaired, but it is, for example, 30% by mass or less, 15% by mass or less, 10% by mass or less, and typically 8% by mass or less.

[Nitrogen-Containing Heterocyclic Compound (B)]

The surface treatment agent includes the nitrogen-containing heterocyclic compound (B). Imparting water repellency to the substrate surface using a conventional silylation agent such as HMDS has reached its limit. Even if the conditions for imparting water repellency are changed, it has been difficult to achieve such a high degree of water repellency that a contact angle of water is 100° or more. On the contrary, when the surface treatment agent includes the nitrogen-containing heterocyclic compound (B), the hydrolysis or condensation of the alkoxymonosilane compound, the bonding to the substrate surface, and the formation of a monomolecular film can be promoted. By pulling out hydrogen from the hydroxyl group existing in the substrate surface, the substrate surface can be activated, and a high degree of water repellency can be achieved, and in particular, for example, the water repellency in which the contact angle of water is 100° or more may be achieved.

The nitrogen-containing heterocyclic compound (B) is not particularly limited as long as it is a compound including a nitrogen atom in the ring structure, but from the viewpoint that a satisfactory effect of the water repellency by the surface treatment agent is achieved, the nitrogen-containing heterocyclic compound (B) includes preferably 2 or more and 5 or less nitrogen atoms, more preferably 2 or more and 4 or less nitrogen atoms, and further preferably 2 or 3 carbon atoms. The nitrogen-containing heterocyclic compound (B) may include a hetero atom other than a nitrogen atom, for example, an oxygen atom, a sulfur atom, and the like, in the ring thereof. The nitrogen-containing heterocyclic compound (B) is preferably a compound including a nitrogen-containing heterocyclic ring having an aromatic property, from the viewpoint of the water repellency of the surface.

The nitrogen-containing heterocyclic compound (B) may be a compound in which two or more rings are bonded by a single bond, or a compound bonded by bi- or poly-valent linking group. In this case, two or more rings bonded by a linking group are only required to include at least one nitrogen-containing heterocycle. In the poly-valent linking group, divalent linking groups are preferable from the viewpoint that the steric hindrance between rings is small. Specific examples of the divalent linking group include an alkylene group having 1 or more and 6 or less carbon atoms, —CO—, —CS—, —O—, —S—, —NH—, —N═N—, —CO—O—, —CO—NH—, —CO—S—, —CS—O—, —CS—S—, —CO—NH—CO—, —NH—CO—NH—, —SO—, —SO$_2$—, and the like. The number of rings included in the compound in which two or more rings are bonded by the poly-valent linking group is preferably 4 or less, more preferably 3 or less, and the most preferably 2 from the viewpoint of easiness in preparing a uniform surface treatment agent. Note here that, in, for example, a condensed ring such as a naphthalene ring, the number of rings is 2.

The nitrogen-containing heterocyclic compound (B) may be a nitrogen-containing heterocyclic compound in which two or more rings are condensed. In this case, at least one ring among the rings constituting the condensed ring is only required to be a nitrogen-containing heterocycle. The number of rings included in the nitrogen-containing heterocyclic compound in which two or more rings are condensed is preferably 4 or less, more preferably 3 or less, and the most preferably 2 from the viewpoint of easiness in preparing a uniform surface treatment agent.

From the viewpoint of surface water repellency, the nitrogen-containing heterocyclic compound (B) preferably includes a condensed polycyclic ring including a nitrogen-containing five-membered ring or a nitrogen-containing five-membered ring skeleton.

As the heterocyclic ring of the nitrogen-containing heterocyclic compound (B), imidazole that may have a substituent, triazol that may have a substituent, tetrazole that may have a substituent, benzotriazole that may have a substituent, or pyrazole that may have a substituent is preferable, and more preferable is one or more selected from the group consisting of imidazole that may have a substituent, triazol that may have a substituent, and tetrazole that may have a substituent.

Examples of the substituents include an alkyl group having 1 or more and 6 or less carbon atoms, a cycloalkyl group having 3 or more and 8 or less carbon atoms, an alkoxy group having 1 or more and 6 or less carbon atoms, a cycloalkyloxy group having 3 or more and 8 or less carbon atoms, an aryl group having 6 or more and 20 or less carbon atoms, an aralkyl group having 7 or more and 20 or less carbon atoms, an alkyl halide group having 1 or more and 6 or less carbon atoms, an aliphatic acyl group having 2 or more and 7 or less carbon atoms, an aliphatic acyl halide group having 2 or more and 7 or less carbon atoms, an aryl carbonyl group having 7 or more and 20 or less carbon atoms, a carboxyalkyl group having 2 or more and 7 or less carbon atoms, a halogen atom, a hydroxyl group, a mercapto group, an alkylthio group having 1 or more and 6 or less carbon atoms, an amino group, a monoalkyl amino group including an alkyl group having 1 or more and 6 or less carbon atoms, a dialkyl amino group including an alkyl group having 1 or more and 6 or less carbon atoms, a nitro group, a cyano group, and the like. The nitrogen-containing heterocyclic compound (B) may have a plurality of substituents on the heterocycle thereof. When a plurality of substituents are included, the plurality of substituents may be the same as or different from each other. When these substituents include an aliphatic hydrocarbon ring, an aromatic hydrocarbon ring, or the like, these rings may further include the same substituents as the substituents which the nitrogen-containing heterocyclic compound (B) may have.

Particularly suitable examples of the heterocyclic compound include a compound represented by the following formula.

[Chem. 1]

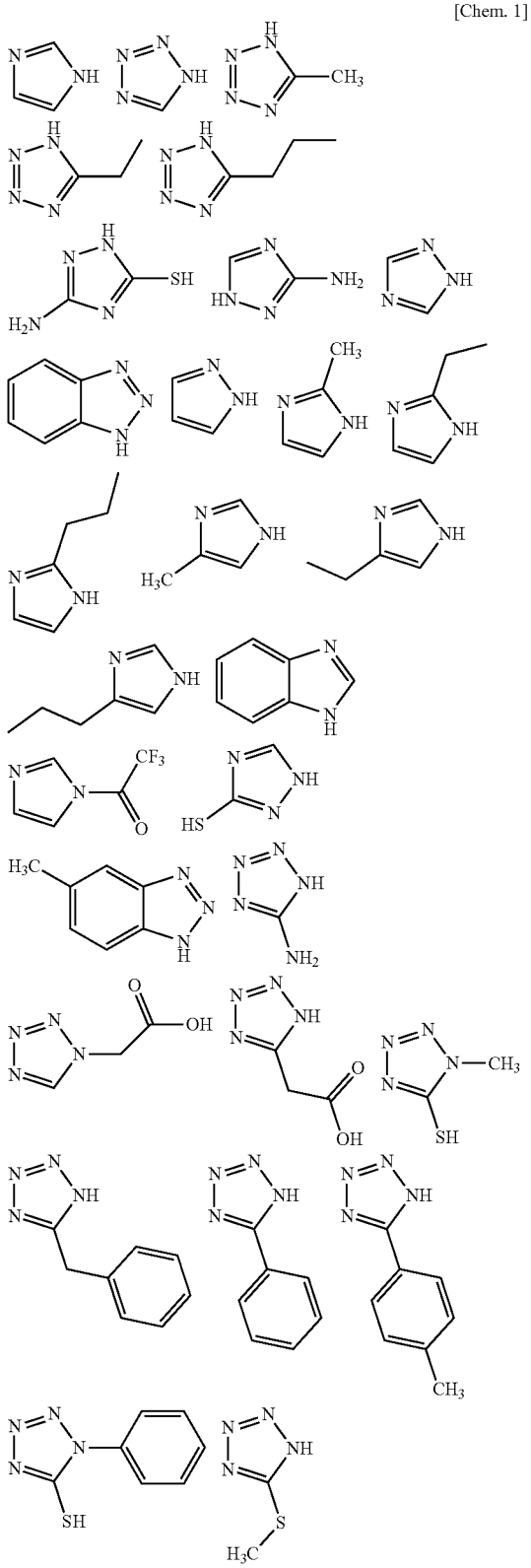

The content of the nitrogen-containing heterocyclic compound (B) in the surface treatment agent is not particularly limited as long as the effect of the present invention is not impaired, but the content with respect to the total amount of the surface treatment agent is preferably 0.001% by mass or more, more preferably 0.01% by mass or more, further preferably 0.1% by mass or more, particularly preferably 0.5% by mass or more, and the most preferably 1.0% by mass or more. The upper limit value of the content of the nitrogen-containing heterocyclic compound (B) in the surface treatment agent is not particularly limited as long as the effect of the present invention is not impaired, but it is, for example, 30% by mass or less, 15% by mass or less, and 10% by mass or less, and typically 5% by mass or less.

[Solvent]

From the viewpoint that when the surface treatment agent includes a solvent, the surface treatment of a substrate can be carried out easily by a dipping method, a spin coating method, and the like, the surface treatment agent preferably contains a solvent.

Specific examples of the solvent include:

sulfoxides such as dimethylsulfoxide;

sulfones such as dimethylsulfone, diethylsulfone, bis(2-hydroxyethyl)sulfone, and tetramethylene sulfone;

amides such as N,N-dimethylformamide, N-methylformamide, N,N-dimethylacetamide, N-methylacetamide, and N,N-dimethylacetamide;

lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone;

imidazolidinones such as 1,3-dimethyl-2-imidazolidinone, 1,3-diethyl-2-imidazolidinone, and 1,3-diisopropyl-2-imidazolidinone;

dialkyl glycol ethers such as dimethyl glycol, dimethyl diglycol, dimethyl trigylcol, methylethyl diglycol, diethyl glycol, and triethylene glycol butyl methyl ether;

monoalcohol-based solvents such as methanol, ethanol, n-propanol, isopropanol, n-butanol, isobutanol, sec-butanol, tert-butanol, n-pentanol, isopentanol, 2-methyl butanol, sec-pentanol, tert-pentanol, 3-methoxybutanol, 3-methyl-3-methoxybutanol, n-hexanol, 2-methyl pentanol, sec-hexanol, 2-ethyl butanol, sec-heptanol, 3-heptanol, n-octanol, 2-ethyl hexanol, sec-octanol, n-nonyl alcohol, 2,6-dimethyl-4-heptanol, n-decanol, sec-undecyl alcohol, trimethyl nonyl alcohol, sec-tetradecyl alcohol, sec-heptadecyl alcohol, phenol, cyclohexanol, methyl cyclohexanol, 3,3,5-trimethyl cyclohexanol, benzyl alcohol, phenyl methyl carbinol, diacetone alcohol, and cresol;

(poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether;

(poly)alkylene glycol monoalkyl ether acetates such as ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, propylene glycol monomethyl ether acetate, and propylene glycol monoethyl ether acetate;

other ethers such as dimethyl ether, diethyl ether, methylethyl ether, dipropyl ether, diisopropyl ether, dibutyl ether, diisoamyl ether, diethylene glycol dimethyl ether, diethylene glycol methylethyl ether, diethylene glycol diethyl ether, tetraethylene glycol dimethyl ether, and tetrahydrofuran;

ketones such as methyl ethyl ketone, cyclohexanone, 2-heptanone, and 3-heptanone;

alkyl lactate esters such as methyl 2-hydroxypropionate and ethyl 2-hydroxypropionate; other esters such as 2-hydroxy-2-methylpropionic acid ethyl, 3-methoxypropionic acid methyl, 3-methoxypropionic acid ethyl, 3-ethoxypropionic acid methyl, 3-ethoxypropionic acid ethyl, ethoxyacetic acid ethyl, hydroxyacetic acid ethyl, 2-hydroxy-3-methylbutanoic acid methyl, 3-methoxybutyl acetate, 3-methyl-3-methoxy-1-butyl acetate, 3-methyl-3-methoxybutyl propionate, ethyl acetate, n-propyl acetate, i-propyl acetate, n-butyl acetate, i-butyl acetate, n-pentyl acetate, n-hexyl acetate, n-heptyl acetate, n-octyl acetate, n-pentyl formate, i-pentyl acetate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, and propylene glycol diacetate; lactones such as β-propiolactone, γ-butyrolactone, and δ-pentyrolactone;

straight-chain, branched chain, or cyclic aliphatic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cyclohexane, and methyl cyclohexane;

aromatic hydrocarbons such as benzene, toluene, xylene, 1,3,5-trimethyl benzene, and naphthalene;

terpenes such as p-menthane, diphenyl menthane, limonene, terpinene, bornane, norbornane and pinane; and the like. These solvents can be used alone or by mixing two or more thereof.

Among the solvents, a solvent that can dissolve the water-repelling agent (A) and the nitrogen-containing heterocyclic compound (B), and give less damage to the surface of the substrate (organic pattern, inorganic pattern, and the like) is preferable. As the solvent, from the viewpoint of dissolving of both the water-repelling agent (A) and the nitrogen-containing heterocyclic compound (B) and achieving water repellency (for example, a contact angle of water), a solvent having a dielectric constant of 1 or more and 25 or less is preferable, a solvent having a dielectric constant of 2 or more and 20 or less is more preferable, a solvent having a dielectric constant of 3 or more and 15 or less is further preferable, a solvent having a dielectric constant of 4 or more and 10 or less is particularly preferable, and a solvent having a dielectric constant of 5 or more and 8 or less is the most preferable.

As a solvent satisfying the above-mentioned dielectric constant, 3-methyl-3-methoxy-1-butyl acetate, ethyl acetate, propylene glycol monomethyl ether acetate, propylene glycol monomethyl ether, diethylene glycol monomethyl ether, isopropanol or methyl ethyl ketone is preferable, and 3-methyl-3-methoxy-1-butyl acetate, ethyl acetate or propylene glycol monomethyl ether acetate is more preferable.

<<Method for Suppressing Collapse of Organic Pattern or Inorganic Pattern>>

A method for suppressing collapse of an organic pattern or an inorganic pattern in cleaning a substrate surface with a cleaning liquid according to the third aspect includes imparting water repellency to the substrate surface having the organic pattern or the inorganic pattern by the method for imparting water repellency according to the first aspect.

It is possible to impart water repellency to a substrate surface, in which at least a part of the surface of the substrate to which water repellency is to be imparted is made of titanium nitride (TiN), tantalum nitride (TaN) or tungsten (W). In particular, it is possible to impart water repellency to a substrate surface made of TiN or TaN. At least a part of the surface of the substrate to which water-repellency is imparted may be made of silicon (Si), silicon nitride (SiN), or silicone oxide film (Ox).

In a cleaning process using a cleaning liquid for a substrate surface having an organic pattern or an inorganic pattern, cleaning liquids that have been conventionally used in cleaning processes of organic patterns or inorganic patterns can be employed without modification. For example, water, activator rinse, and the like, can be exemplified for the organic pattern, and SPM (sulfuric acid/hydrogen peroxide solution), APM (ammonia/hydrogen peroxide solution), and the like, can be exemplified for the inorganic pattern.

The reason why pattern collapse of the organic pattern or the inorganic pattern on the substrate surface can be prevented during cleaning of the substrate surface by imparting water repellency to the substrate surface having the organic pattern or the inorganic pattern with the method for imparting water repellency according to the first aspect will be described.

Usually, after an inorganic pattern has been formed on the substrate surface, the surface of the pattern is generally cleaned using a cleaning liquid such as SPM and APM. In addition, also after an organic pattern has been formed on the surface of a substrate, developing residue and adhering developing solution are generally cleaned and removed using a cleaning liquid such as water and an activator rinse. Prior to cleaning the organic pattern or the inorganic pattern, the pattern surface is treated with the surface treatment agent, and water repellency is imparted to the surface of the pattern.

Herein, the force F acting between the patterns of the organic pattern and the inorganic pattern during cleaning is represented as in the following formula (a). In the formula, γ represents surface tension of the cleaning liquid, θ represents a contact angle of the cleaning liquid, A represents an aspect ratio of the pattern, and D represents a distance between the pattern side walls.

$$F = 2\gamma \cdot \cos \theta \cdot A/D \tag{a}$$

Therefore, if water repellency can be imparted to the surface of the pattern, and the contact angle of the cleaning liquid can be increased (or $\cos \theta$ can be reduced), the force acting between the patterns during the following cleaning can be reduced, and thus the pattern collapse can be prevented.

This surface treatment is performed by dipping the substrate, on which an inorganic pattern or a resin pattern has been formed, in the surface treatment agent, or by applying or spraying the surface treatment agent on the inorganic pattern or the resin pattern. A preferable range of the surface treatment time can be exemplified by the preferable range the same as described above as an exposure time in the method for imparting water repellency to a substrate according to the first aspect. Furthermore, a preferable range of the contact angle of water after surface treatment of the pattern surface can be exemplified by the preferable range the same as described above as a contact angle of water on the substrate after being exposed to the surface treatment agent in the method for imparting water repellency to a substrate according to the first aspect.

carry out the surface treatment of the substrate. The substrate after surface treatment was cleaned with isopropanol for one minute, and then cleaned with ion-exchanged distilled water for one minute. The cleaned substrate was dried by nitrogen flow so as to obtain a surface-treated substrate.

(Measurement of Contact Angle of Water)

The contact angles of water of each substrate after the HF pretreatment and each substrate after the surface treatment were measured. The contact angle of water was measured using Dropmaster 700 (manufactured by Kyowa Interface Science Co., Ltd.) as follows: a pure water droplet (2.0 µL) was dropped onto a surface-treated surface of a substrate, and the contact angle after 2 seconds of dropping was measured. Results are shown in Table 1.

TABLE 1

| | Water-repelling agent (A) | Compound (B) | Surface treatment conditions | Water contact angle (°) | | |
|---|---|---|---|---|---|---|
| | | | | SiN | Ox | W |
| After HF-pretreatment | | None | None | 28.6 | 8.1 | 24.2 |
| Comparative Example 1 | n-octyltrimethoxysilane | None | 60° C.10 minutes | 31.4 | 51.6 | 23.5 |
| Example 1 | n-octyltrimethoxysilane | Imidazole | 60° C.10 minutes | 57.5 | 95.5 | 33.9 |
| Example 2 | n-octyltrimethoxysilane | Tetrazole | 60° C.10 minutes | 45.0 | 66.0 | 47.3 |
| Example 3 | n-octyltrimethoxysilane | Triazole | 60° C.10 minutes | 43.0 | 67.4 | 24.1 |

Note here that the exposure to the surface treatment agent and the cleaning process are preferably continuous processes from the viewpoint of throughput. Consequently, as the surface treatment agent, it is preferable to select an agent that is excellent in displaceability with the cleaning liquid.

EXAMPLES

Hereinafter, the present invention will be described more specifically by showing Examples, but the scope of the present invention is not limited to these Examples.

Examples 1 to 3 and Comparative Example 1

(Preparation of Surface Treatment Agent)

In 91.2 g of 3-methyl-3-methoxy-1-butyl acetate as a solvent, 7.8% by mass of n-octyltrimethoxysilane as the water-repelling agent (A) and 1.0% by mass of the nitrogen-containing heterocyclic compound (B) (hereinafter, also simply referred to as "compound (B)") described in Table 1 were mixed uniformly to prepare surface treatment agents of Examples 1 to 3 and Comparative Example 1.

(Surface Treatment)

According to the following method using the obtained surface treatment agents of Examples 1 to 3 and Comparative Example 1, surface treatment was carried out on a silicon nitride substrate (SiN), a silicon thermal oxide film substrate (Ox), and a tungsten substrate (W). Specifically, each substrate was dipped in an HF aqueous solution having a concentration of 0.5% by mass at 25° C. for one minute to carry out pretreatment. After the pretreatment, the substrate was cleaned with ion-exchanged distilled water for one minute. The substrate after cleaning with water was dried by nitrogen flow. The substrate after drying was dipped in each of the surface treatment agents at 60° C. for 10 minutes to As is apparent from the results shown in Table 1, it is shown that the water contact angles to all substrates are improved in a case where the surface treatment agent of Examples 1 to 3 containing the compound (B) together with the water-repelling agent (A) is used as compared with Comparative Example 1 that does not contain the compound (B). In particular, it is shown that when the surface treatment agents of Examples 1 and 2 containing the compound (B) including two or three nitrogen atoms are used, the improvement of the water contact angle is particularly large.

Examples 4 to 8

(Preparation of Surface Treatment Agent)

In 3-methyl-3-methoxy-1-butyl acetate as a solvent, 7.8% by mass of each water-repelling agent (A) described in the following Table 2, and 1.0% by mass of imidazole as the compound (B) were mixed uniformly so as to prepare surface treatment agents of Examples 4 to 8.

(Surface Treatment)

By using the obtained surface treatment agents of Examples 4 to 8, similar to Examples 1 to 3 and Comparative Example 1, after pretreatment with an HF aqueous solution, surface treatment of a SiN substrate, an Ox substrate, a W substrate, and a titanium nitride substrate (TiN) was carried out, and contact angles of water of each substrate after the HF pretreatment and each substrate after the surface treatment were measured. Measurement of the contact angle of water was carried out in the same manner as mentioned above. Results are shown in the following Table 2.

TABLE 2

| Water-repelling agent (A) | Chain length (number of carbon atoms) | Surface treatment conditions | Water contact angle (°) | | | |
| --- | --- | --- | --- | --- | --- | --- |
| | | | SiN | Ox | W | TiN |
| After HF-pretreatment | None | None | 30.9 | 5.0 | 23.6 | 15.6 |
| Example 4 n-propyltrimethoxysilane | 3 | 60° C.10 minutes | 41.3 | 67.5 | 23.5 | ND |
| Example 5 n-hexyltrimethoxysilane | 6 | 60° C.10 minutes | 35.9 | 68.6 | 14.2 | ND |
| Example 6 n-octyltrimethoxysilane | 8 | 60° C.10 minutes | 51.8 | 92.6 | 34.8 | 117.6 |
| Example 7 n-dodecyltrimethoxysilane | 11 | 60° C.10 minutes | 76.5 | 103.0 | 58.9 | 123.5 |
| Example 8 n-octadecyltrimethoxysilane | 18 | 60° C.10 minutes | 34.3 | 74.9 | 39.8 | 106.2 |

ND: No Data

As is apparent from the results shown in Table 2, it is shown that as compared with Examples 4 and 5 in which the number of carbon atoms of a straight-chain alkyl group as a hydrophobic group of alkoxymonosilane as the water-repelling agent is 3 and 6, a water contact angle with respect to all substrates is improved in Examples 6 to 8 in which the number of carbon atoms of a straight-chain alkyl group as the hydrophobic group is 8, 11, and 18. In particular, it is shown that the improvement of the water contact angle tends to be particularly large when the surface treatment agents of Examples 6 and 7 in which the number of carbon atoms of the straight-chain alkyl group is 8 and 11 are used.

Example 9

(Preparation of Surface Treatment Agent)
In each of the following solvents, 7.8% by mass of n-octyltrimethoxysilane as the water-repelling agent (A), and 1.0% by mass of imidazole as the compound (B) were mixed uniformly to prepare a surface treatment agent. Isopropyl alcohol (IPA)
Methyl ethyl ketone (MEK)
Ethyl acetate
3-methyl-3-methoxybutanol (MMB)
Propylene glycol monomethyl ether (PGME)
Diethylene glycol monomethyl ether (MDG)
Propylene glycol monomethyl ether acetate (PGMEA)
3-methyl-3-methoxy-1-butyl acetate (MMBA)
(Surface Treatment)
By using the obtained surface treatment agents, similar to Examples 1 to 3 and Comparative Example 1, after pretreatment with an HF aqueous solution, surface treatment of an Ox substrate was carried out, and the contact angles of water of the substrate after the surface treatment were measured. Measurement of the contact angle of water was carried out in the same manner as mentioned above. Then, for the Ox substrate, the relationship between each solvent and the water contact angle is summarized in FIG. 1.

FIG. 1 is a view showing the relationship between the water contact angle in the Ox substrate, and dielectric constants of various solvents. From the relationship shown in FIG. 1 between the water contact angle in the substrate and the dielectric constants of various solvents, from the viewpoint of improvement of the water contact angle on the substrate, that is, improvement of the water repellency, it is shown that a solvent having a dielectric constant of 1 or more and 25 or less is preferable. Specifically, it is shown that 3-methyl-3-methoxy-1-butyl acetate, ethyl acetate, or propylene glycol monomethyl ether acetate is particularly preferable.

Example 10 and Comparative Examples 2 and 3

(Preparation of Surface Treatment Agent)
In 3-methyl-3-methoxy-1-butyl acetate as a solvent, 5.0% by mass of a conventional silylation agent HMDS was mixed uniformly to prepare a surface treatment agent of Comparative Example 2. A surface treatment agent of Comparative Example 3 was prepared in the same manner as in Comparative Example 2 except that 3.5% by mass of imidazole as the compound (B) was further mixed. A surface treatment agent of Example 11 was prepared in the same manner as in Comparative Example 3 except that 5.0% by mass of n-octyltrimethoxysilane, instead of 5.0% by mass of HMDS, was uniformly mixed.
(Surface Treatment)
By using the obtained surface treatment agents of Example 10 and Comparative Examples 2 and 3, similar to Examples 1 to 3 and Comparative Example 1, after pretreatment with an HF aqueous solution, surface treatment of a Si substrate, a W substrate, a cobalt substrate (Co), a titanium nitride substrate (TiN), and a tantalum nitride substrate (TaN) was carried out, and the contact angles of water of each substrate after the HF pretreatment and each substrate after the surface treatment were measured. Measurement of the contact angle of water was carried out in the same manner as mentioned above. Results are shown in the following Table 3.

TABLE 3

| | Water repelling agent | Compound (B) | Surface treatment conditions (°) | | | | |
| --- | --- | --- | --- | --- | --- | --- | --- |
| | | | Si | W | Co | TiN | TaN |
| After HF-pretreatment | | | 71.7 | 18.2 | 24.1 | 10.5 | 58.7 |
| Comparative Example 2 | HMDS | None | 77.3 | 7.7 | 32.9 | 21.6 | 68.2 |
| Comparative Example 3 | HMDS | Imidazole | 83.4 | 5.8 | 35.3 | 9.8 | 65.4 |
| Example 10 | n-octyltrimethoxysilane | Imidazole | 91.6 | 9.3 | 36.8 | 85.1 | 72.7 |

As is apparent from the results shown in Table 3, it is shown that the water contact angles with respect to all substrates are improved in Example 10 including n-octyltrimethoxysilane and imidazole as compared with Comparative Examples 2 and 3 using the conventional silylation agent HMDS. Furthermore, from the results, it is shown that a surface treatment agent including the water-repelling agent (A) and the compound (B) can impart water repellency to the W substrate, the TiN substrate, and the TaN substrate, in which water repellency has not easily been imparted by the conventional silylation agent HMDS.

Note here that surface treatment of a Si substrate, a W substrate, and a TiN substrate using a surface treatment agent similar to the surface treatment agent of Example 10 except that the content of imidazole is changed to 0.5% by mass, 1% by mass, and 3% by mass, respectively, results in a satisfactory contact angle of water being achieved in the Si substrate, the W substrate, and the TiN substrate in all cases where the content of imidazole is 0.5% by mass, 1% by mass, and 3% by mass.

What is claimed is:

1. A method for imparting water repellency to a substrate, the method comprising exposing a surface of a substrate to a surface treatment agent,
    wherein at least a part of the surface of the substrate, to which water repellency is to be imparted, is made of TiN, TaN, or W,
    wherein the surface treatment agent comprises a water-repelling agent (A) and a nitrogen-containing heterocyclic compound (B), and
    wherein the water-repelling agent (A) comprises an alkoxymonosilane compound having a hydrophobic group bonded to a silicon atom.

2. The method for imparting water repellency according to claim 1, wherein the nitrogen-containing heterocyclic compound (B) is one or more selected from the group consisting of an imidazole that may have a substituent, a triazol that may have a substituent, and a tetrazole that may have a substituent.

3. The method for imparting water repellency according to claim 1, wherein the alkoxymonosilane compound is a trialkoxymonosilane compound.

4. The method for imparting water repellency according to claim 1, wherein the hydrophobic group of the alkoxymonosilane compound is a chain aliphatic hydrocarbon group having 3 or more and 20 or fewer carbon atoms.

5. The method for imparting water repellency according to claim 1, wherein the substrate has an organic pattern or an inorganic pattern on a surface to be exposed to the surface treatment agent.

6. A method for suppressing collapse of an organic pattern or an inorganic pattern in cleaning a substrate surface with a cleaning liquid, the method comprising imparting water repellency to the substrate surface having an organic pattern or an inorganic pattern by the method according to claim 5.

7. A method for imparting water repellency to a substrate, the method comprising exposing a surface of a substrate used for producing a semiconductor device to a surface treatment agent,
    wherein the surface treatment agent comprises a water-repelling agent (A) and a nitrogen-containing heterocyclic compound (B),
    the water-repelling agent (A) comprises an alkoxymonosilane compound having a hydrophobic group bonded to a silicon atom,
    the nitrogen-containing heterocyclic compound (B) is one or more selected from the group consisting of imidazole that may have a substituent, triazol that may have the substituent, and tetrazole that may have the substituent, and
    the substituent is at least one selected from the group consisting of an alkyl group having 1 or more and 6 or less carbon atoms, a cycloalkyl group having 3 or more and 8 or less carbon atoms, an alkoxy group having 1 or more and 6 or less carbon atoms, a cycloalkyloxy group having 3 or more and 8 or less carbon atoms, an aryl group having 6 or more and 20 or less carbon atoms, an aralkyl group having 7 or more and 20 or less carbon atoms, an alkyl halide group having 1 or more and 6 or less carbon atoms, an aliphatic acyl group having 2 or more and 7 or less carbon atoms, an aliphatic acyl halide group having 2 or more and 7 or less carbon atoms, an aryl carbonyl group having 7 or more and 20 or less carbon atoms, a carboxyalkyl group having 2 or more and 7 or less carbon atoms, a halogen atom, a hydroxyl group, a mercapto group, an alkylthio group having 1 or more and 6 or less carbon atoms, an amino group, a monoalkyl amino group including an alkyl group having 1 or more and 6 or less carbon atoms, a dialkyl amino group including an alkyl group having 1 or more and 6 or less carbon atoms, a nitro group, and a cyano group.

8. The method for imparting water repellency according to claim 7, wherein the substrate is a semiconductor substrate.

9. The method for imparting water repellency according to claim 7, wherein the hydrophobic group of the alkoxymonosilane compound is a chain aliphatic hydrocarbon group having 6 or more and 20 or less carbon atoms.

10. The method for imparting water repellency according to claim 7, wherein the nitrogen-containing heterocyclic compound (B) is at least one selected from the group consisting of the triazol that may have the substituent and the tetrazole that may have the substituent.

* * * * *